United States Patent [19]

Nagai et al.

[11] Patent Number: 5,444,256
[45] Date of Patent: Aug. 22, 1995

[54] ELECTROSTATIC LENS AND METHOD FOR PRODUCING THE SAME

[75] Inventors: Takamitsu Nagai; Yuichiro Yamazaki; Motosuke Miyoshi, all of Tokyo, Japan

[73] Assignee: Kabushiki Kaisha Toshiba, Kawasaki, Japan

[21] Appl. No.: 168,160

[22] Filed: Dec. 17, 1993

[30] Foreign Application Priority Data

Dec. 17, 1992 [JP] Japan ................................. 4-337408

[51] Int. Cl.⁶ ............................................. H01J 37/12
[52] U.S. Cl. .................................. 250/396 R; 250/398
[58] Field of Search ............ 250/396 R, 396 ML, 398; 29/602.1, 825; 313/361.1

[56] References Cited

U.S. PATENT DOCUMENTS 5,293,045  3/1994  Miyoshi et al. .................. 250/396 R

FOREIGN PATENT DOCUMENTS 60-236443  11/1985  Japan .

*Primary Examiner*—Paul M. Dzierzynski
*Assistant Examiner*—Kiet T. Nguyen
*Attorney, Agent, or Firm*—Oblon, Spivak, McClelland, Maier & Neustadt

[57] ABSTRACT

An electrostatic lens produces a smooth potential distribution along the center axis and is reduced in lens size and in total shape. A metal layer 13 is deposited at a certain position on an inner surface of insulating cylinder 11, and a high-resistance layer 12 is deposited on a portion except for the metal layer 13 on the inner surface of cylinder 11. A negative potential is applied from an external power source 19 to the metal layer 13, and the high-resistance layer 12 is earthed.

10 Claims, 5 Drawing Sheets

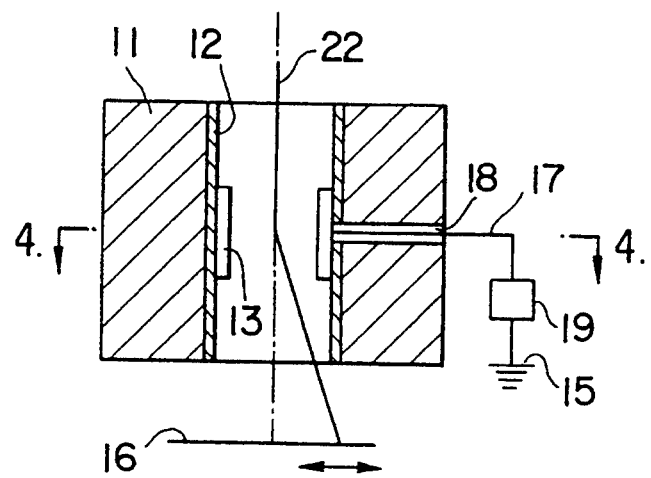
F I G. 3
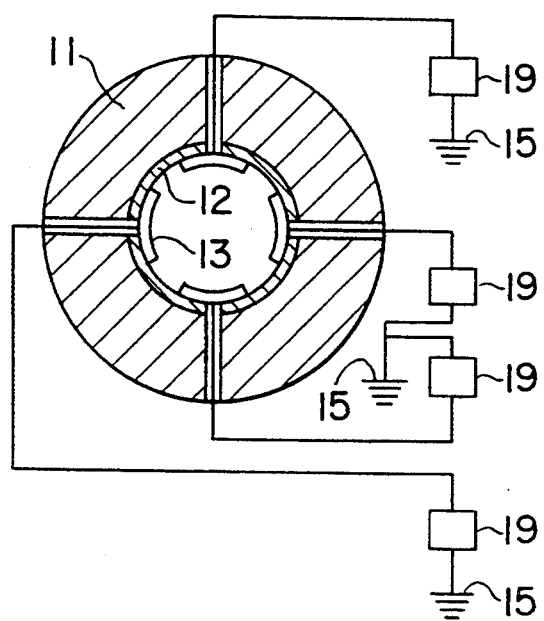
F I G. 4

ELECTROSTATIC LENS AND METHOD FOR PRODUCING THE SAME

BACKGROUND OF THE INVENTION

1. Field of the Invention

The present invention relates to an electrostatic lens used in electron microscope, or electron or ion-beam-utilizing apparatus, and to a method for producing it.

2. Related Background Art

An electrostatic lens has been used as an electron-gun lens in electron microscope or as a focusing lens in ion-beam apparatus.

FIG. 5 shows a typical example of conventional cylindrical electrostatic lens and a ray diagram thereof.

In FIG. 5, reference numeral 24 designates a position of electron gun or crossover. An electron beam emerges at a divergence angle from the electron-gun or crossover position 24. A first electrode 25 is earthed to earth 30, a second central electrode 26 is connected to a power source 19 in a negative potential forming a lens electric field, and a third electrode 27 is earthed to the earth 30.

The electrostatic lens with the structure shown in FIG. 5 is generally called as einzel lens, which is composed of three electrodes 25, 26, 27. The electrostatic lens is thus constructed of a plurality of cylinder or disk electrodes, such as the electrodes 25, 26, 27. When a voltage is applied from the power source 19 to the second electrode 26, an electron beam is focused on a sample table 29. FIG. 6 shows a potential distribution of this electrostatic lens. As shown in FIG. 6, a potential peak (—Vp) appears at the second electrode 26 and the potential decreases to zero toward either of the first and third electrodes 25, 27. The smoother the shape of potential distribution in FIG. 6 the smaller the lens aberration as long as the focus position is fixed.

FIG. 7 shows another electrostatic lens. The electrostatic lens shown in FIG. 7 provides an asymmetric distribution of axial potential to reduce aberration, which is called as asymmetric einzel lens. Similarly as in FIG. 5, a first electrode 31 is earthed, a second central electrode 32 is kept in a negative potential forming a lens electric field, and a third electrode 33 is kept earthed. In FIG. 7, the electrodes 31, 32, 33 are held by a ceramic holder 34 for insulation.

In the electrostatic lens shown in FIG. 5 or in FIG. 7, an electron beam emerges from the electron-gun or crossover position 24 (FIG. 5) and focuses at the sample table 29 through the electrostatic lens.

In the example shown in FIG. 7, the electrodes 31, 32, 33 in the electrostatic lens are held and fixed by the ceramic holder 34 (insulator). The ceramic holder 34 keeps the positional accuracy between the electrodes 31, 32, 33. The electrodes 25, 26, 27 are also held and fixed by an unrepresented ceramic holder in the electrostatic lens shown in FIG. 5.

As described above, either electrostatic lens shown in FIG. 5 or in FIG. 7 includes a plurality of (for example three) electrodes held and fixed by a ceramic holder. However, in order to hold and fix a plurality of electrodes by a ceramic holder, assembling is not easy with troublesome work for accurately positioning the electrodes with respect to the center axis of electron beam.

Also, in case of the electrostatic lens shown in FIG. 7, each electrode is formed in a complicated shape in order to prevent electrification in the ceramic holder and to reduce lens aberration. If the electrodes are formed in complicated shape for electrification prevention in the ceramic holder, the ceramic holder must also have a complicated shape matching the electrodes, which makes the production difficult and increases the size of entire lens.

SUMMARY OF THE INVENTION

The present invention has been accomplished taking the above-described points into consideration. It is an object of the present invention to provide an electrostatic lens which is improved in lens accuracy and which is easy in machining and assembling, and to provide a method for producing the same.

An electrostatic lens according to the present invention comprises:

an insulating cylinder;

a metal layer deposited at a predetermined position on an inner surface of the insulating cylinder; and a high-resistance layer deposited on a portion except for said metal layer on the inner surface of insulating cylinder;

wherein a voltage is applied from an external power source to said metal layer and wherein said high-resistance layer is earthed.

A method for producing an electrostatic lens according to the present invention comprises:

a step of coating an inner surface of an insulating cylinder by a high-resistance layer;

a step of coating a predetermined position of said insulating cylinder by a metal layer;

a step of electrically connecting between said metal layer and an external power source; and a step of making said high-resistance layer earthed.

When a potential is applied from the external power source to the metal layer, a potential distribution is produced on the metal layer and the high-resistance layer. A change of potential distribution is smooth along the central axis of insulating cylinder.

BRIEF DESCRIPTION OF THE DRAWINGS

FIG. 3 is a sectional side view to show another embodiment of electrostatic lens according to the present invention;

FIG. 4 is a cross section of the electrostatic lens shown in FIG. 3 along IV—IV line;

DESCRIPTION OF THE PREFERRED EMBODIMENTS

Figure 1:
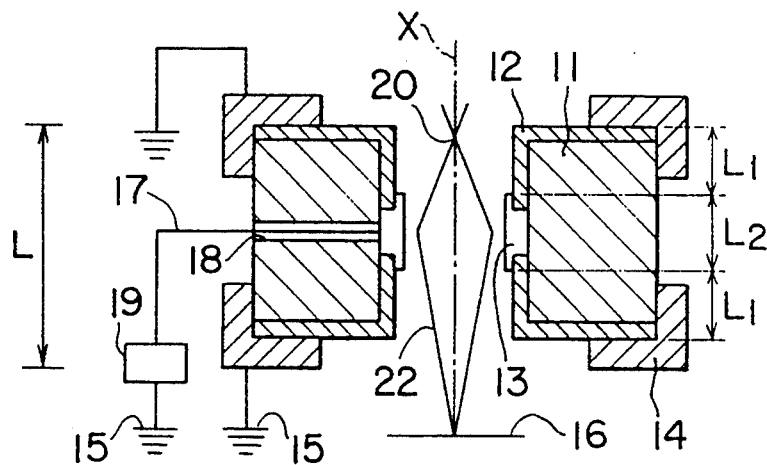
FIG. 1 is a sectional side view to show an embodiment of electrostatic lens according to the present invention.
Figure 2:
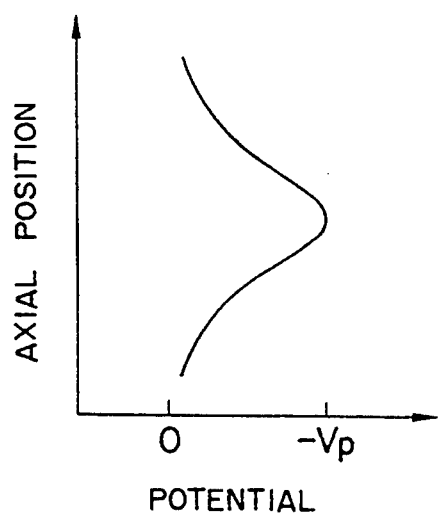
FIG. 2 is a drawing to show a potential distribution along the center axis of the electrostatic lens according to the present invention.

Embodiments of the present invention will be described in detail with reference to the accompanying drawings. FIG. 1 and FIG. 2 are drawings to show an embodiment of the present invention.

In FIG. 1, the electrostatic lens has a cylindrical insulating barrel (cylinder) 11 made of aluminum nitride (AlN). There is a belt-like coating of metal layer 13 made of aluminum (Al), which is provided at a predetermined position on the inner surface of insulating cylinder 11, for example nearly in the center portion in the axial direction and along the circumference of the inner surface. Coating of high-resistance layer 12 made of silicon carbide (SIC) is formed over the entire region except for the metal layer 13 on the inner surface of cylinder 11 and over the upper and lower surfaces of cylinder 11. The high-resistance layer 12 of SiC readily changes its resistivity simply by adjusting its conductivity.

A through hole 18 is formed through the cylinder 11 between the inner surface and the outer surface thereof in the direction perpendicular to the axial direction of cylinder 11. The metal layer 13 is electrically connected to an external power source 19 by a wire 17 set in the through hole 18. The external power source 19 applies a voltage to the metal layer 13 so that the metal layer 13 is kept in a negative potential. The external power source 19 is earthed to earth 15. The insulating cylinder 11 is fixed and held by a metal holder 14, which is earthed to the earth 15. The metal holder 14 is in contact with the high-resistance layer 12 on the cylinder 11.

The shape of each element is next described. As shown in FIG. 1, the insulating cylinder 11 has its axial length L, for example about 10 mm, in which the length of high-resistance layer 12 is $L_1$ and the length of metal layer 13 is $L_2$. The thickness of high-resistance layer 12 is 50 angstroms and the thickness of metal layer 13 is 250 angstroms. The resistivity of high-resistance layer, 12 of SiC is about $10^3$ to $10^5$ $\Omega.cm$. The high-resistance layer may be made of a material other than SiC, for example carbon (C). The resistivity of high-resistance layer 12 is preferably $10^3$ to $10^5$ $\Omega.cm$ for example.

Next described is a method for producing such electrostatic lens.

The insulating cylinder 11 made of aluminum nitride is first prepared. The through hole 18 is preliminarily formed through the cylinder 11 between the inner surface and the outer surface thereof. Next, the coating of high-resistance layer 12 made of silicon carbide is formed by the CVD method on the inner surface, the upper and lower surfaces of cylinder 11. After that, the high-resistance layer 12 is subjected to etching to form a belt-like etched portion in the central portion on the inner surface of cylinder 11 and along its circumference. Then the metal layer 13 of aluminum is deposited by sputtering on the etched portion in the high-resistance layer 12 on the inner surface of cylinder 11. After that, the cylinder 11 is fixed and held by the metal holder 14, and electric connection is completed between the metal layer 13 on the inner surface of cylinder 11 and the external power source 19 by the wire 17 set in the through hole 18. Then the metal holder 14 and the external power source 19 are earthed. Such process provides the electrostatic lens shown in FIG. 1.

Next described is the operation in the present embodiment as so arranged.

When the negative voltage is first applied from the external power source 19 to the metal layer 13, a current flows between the metal layer 13 and the metal holder 14 through the high-resistance layer 12. A potential distribution is produced along the high-resistance layer 12 in this case, because the high-resistance layer 12 has a greater resistance. FIG. 2 shows the potential distribution produced along the center axis X by the potential on the metal layer 13 and the high-resistance layer 12.

Figure 6:
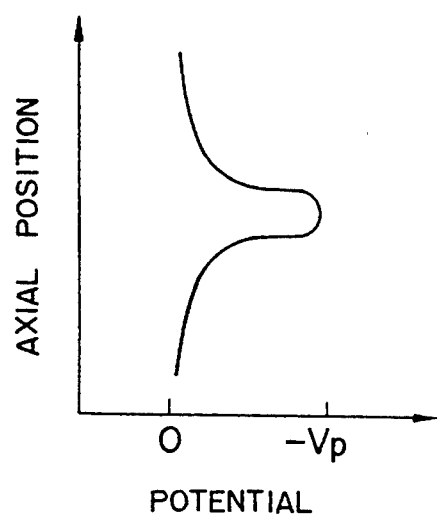
FIG. 6 is a drawing to show a potential distribution along the center axis of the electrostatic lens shown in FIG. 5.

As shown in FIG. 2, a potential peak ($-V_p$) appears at the position corresponding to the metal layer 13. The potential gradually decreases in the upward and downward directions as approaching the zero potential. Since the high-resistance layer 12 has a large resistance as described above, the change of potential distribution is generally smooth. In case of the conventional electrostatic lens with a plurality of electrodes, the potential distribution along the center axis greatly changes in the vicinity of the second electrode 26, as shown in FIG. 6. In contrast, the change of potential distribution is smooth in the present invention (FIG. 2).

The present embodiment is effective to smooth the potential distribution along the center axis and to provide a low-aberration electrostatic lens by optimization of potential distribution by changing the shape of high-resistance layer 12, for example the thickness thereof. Therefore, the electron beam 22, which emerges at a certain divergence angle with respect to the center axis X from the electron-gun or crossover position 20, can be focused with precision on the sample table 16.

Figure 5:
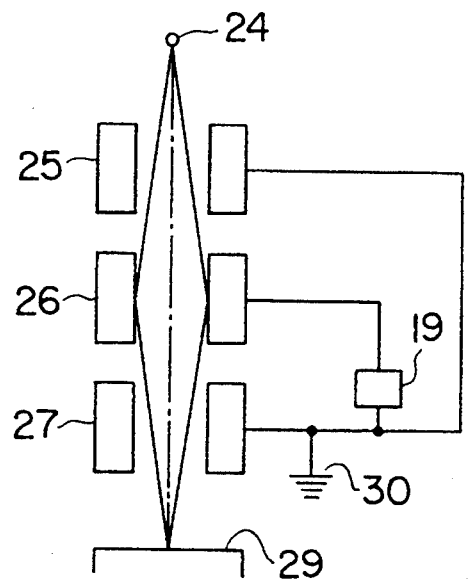
FIG. 5 is a schematic side view to show a conventional electrostatic lens.
Figure 7:
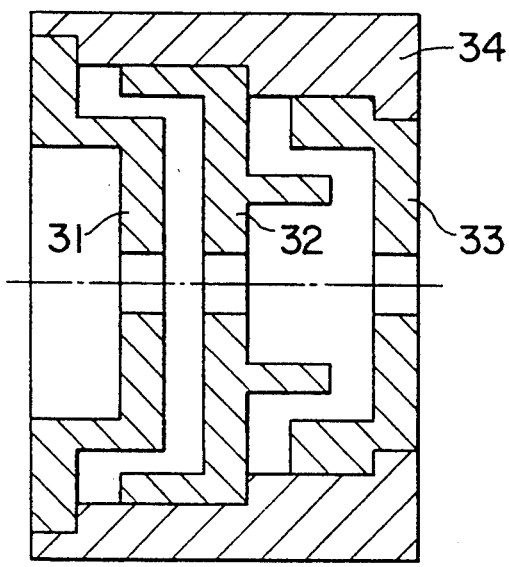
FIG. 7 is a schematic sectional side view to show another conventional electrostatic lens.

In the present embodiment the electrostatic lens is obtained by laminating the metal layer 13 and the high-resistance layer 12 on the insulating cylinder 11, which can obviate the plurality of (three) electrodes as in the conventional electrostatic lens shown in FIG. 5 or FIG. 7. In the conventional electrostatic lenses, the electrodes must be accurately assembled in the holder by screwing or fitting, which could make the shape complicated and increase the total size. In contrast, the electrostatic lens in the present embodiment need not be assembled by screwing or fitting, and, therefore, the total size thereof, especially the lens diameter, can be decreased. Further, the insulating cylinder 11 requires little complicated machining, which improves the shape accuracy. Also, since the current flows through the high-resistance layer 12, the electrification could be avoided in the high-resistance layer 12 even if the electron beam 22 should impinge on the high-resistance layer 12.

The above embodiment showed an example in which a single layer of metal layer 13 is deposited nearly on the center portion on the inner surface of insulating cylinder 11, but the arrangement is not limited to this example. For example, a plurality of metal layers may be deposited along the longitudinal direction of insulating cylinder 11 which is extended in the longitudinal direction. The plurality of metal layers can be arranged to function as lens or deflector, whereby a plurality of lenses and deflectors, serving as gun lens or objective lens, may be incorporated in the cylinder 11. The alignment accuracy can be improved in such arrangement in which a plurality of lenses and deflectors are incorporated in the cylinder.

Further, although the above example employs the AlN cylinder as the insulating cylinder 11, the cylinder is not limited to it. For example, the insulating cylinder 11 may be a machinable ceramic cylinder which is excellent in machining accuracy and usable in vacuum.

Additionally, the metal layer 13 may be formed at a position deviated from the near center portion of insulating cylinder 11 to form an asymmetric potential distribution. The aberration can be further decreased by such arrangement.

Also, the insulating cylinder 11 may be not only cylindrical but also rectangular or polygonal.

Specific Example

Figure 8:
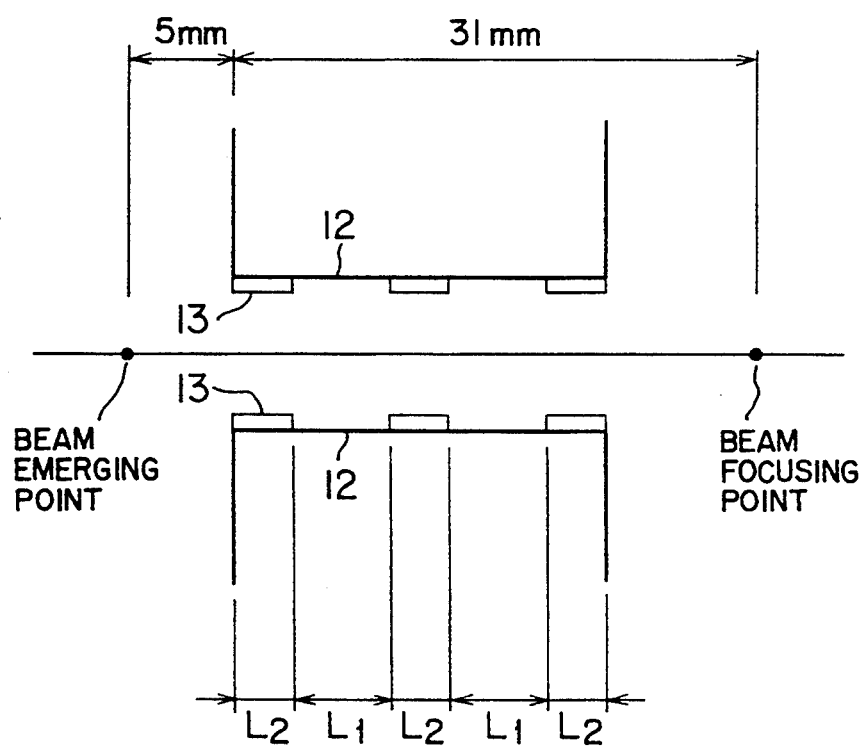
FIG. 8 is a drawing to show a specific example of the present invention.

Next described with a specific example is a relation between axial length of high-resistance layer 12 and metal layer 13 and spherical aberration coefficient. Simulation of lens aberration was conducted using a lens of the invention as a plurality of metal layers 13 are extended along the circumferential direction of the inner surface of the insulating cylinder in a plurality of belt zones and arranged at a plurality of positions in the axial direction of the cylinder (as shown in FIG. 8) which is equivalent in structure to the ordinary electrostatic lens shown in FIG. 5. Comparison was made with fixed distance of 36 mm between electron beam emergent point and focusing point.

In the simulation, letting $L_1$ be the axial length of high-resistance layer 12 and $L_2$ be the axial length of metal layer 13, the length $L_2$ of metal layer 13 was fixed at 2 mm and the axial length $L_1$ of high-resistance layer 12 was changed to be either 1, 2 or 5 mm.

The comparison was made at the same focus distance, and the lens aberration was defined as 1 in the case that the length $L_1$ of high-resistance layer $=1$ mm and the length $L_2$ of metal layer $=2$ mm. Other lens aberrations were obtained with a change in length $L_1$ of high-resistance layer as a ratio to the reference lens aberration. The results are shown in the following table.

TABLE

| $L_1/L_2$ | 0.5 | 1 | 2.5 |
|---|---|---|---|
| $C_{SO}$ | 1 | 0.88 | 0.54 |

In the above table $C_{SO}$ represents spherical aberration coefficient on the object plane side, which could influence the performance of lens. The smaller the coefficient $C_{SO}$, the better the lens performance.

As seen from the above table, the coefficient $C_{SO}$ becomes smaller under the above conditions as the ratio $L_1/L_2$ increases, thus improving the lens performance.

The present invention employs the condition of $L_1/L_2 \geq 1$ to decrease $C_{SO}$ so as to improve the lens performance. That is, (the length $L_1$ of high-resistance layer) / (the length $L_2$ of metal layer) $\geq 1$.

Another embodiment of the present invention is next described referring to FIG. 3 and FIG. 4.

The present embodiment is substantially the same as the embodiment shown in FIGS. 1 and 2 except that the arrangement of high-resistance layer 12 and metal layer 13 is changed. In FIG. 3 and FIG. 4, elements equivalent to those in FIG. 1 and FIG. 2 are denoted by the same reference numerals and omitted to describe in detail herein.

In FIGS. 3 and 4, a high-resistance layer 12 covers the entire inner surface of insulating cylinder 11. A metal layer 13 is deposited on the high-resistance layer 12 nearly in the center portion of insulating layer 11.

The metal layer 13 is constituted of four segments disposed at certain intervals (apart 90° from each other) in the circumferential direction inside the insulating cylinder 11. Each segment in the metal layer 13 is connected to an external power source 19 by a wire 17 set in a through hole 18 formed through the insulating cylinder 11. Each external power source 19 applies a negative potential to the metal layer 13 and is earthed to earth 15.

In the present embodiment, beam scan can be carried out by applying a sawtooth voltage from the external power sources 19 to the corresponding segments in the metal layer 13. In this case, the four segments in the layer 13 function as beam scan electrodes.

Although in the above embodiment the beam scan was described in the use of the four metal layer segments 13 as beam scan electrodes, the four metal layer segments 13 may be used as electrodes for internal multi-pole lens. Also, without being limited to the four metal layer segments 13, eight metal layer segments 13 may be provided in the circumferential direction as to serve as astigmatic compensator, multi-pole lens or deflector.

As detailed above, the present invention is effective to produce a smooth potential distribution along the center axis of insulating cylinder. The invention thus provides a low-aberration electrostatic lens. In addition, the lens size and the total shape can be made smaller, because the lens of the invention needs no mechanical assembly as needed for the arrangement with a plurality of electrodes and a holder in the conventional electrostatic lenses. The lens of the invention requires no complicated assembling work.

What is claimed is:

1. An electrostatic lens comprising:
    an insulating cylinder;
    a metal layer deposited at a predetermined position on an inner surface of the insulating cylinder; and
    a high-resistance layer deposited on a portion other than said predetermined position on the inner surface of the insulating cylinder;
    wherein a voltage is applied from an external power source to said metal layer and wherein said high-resistance layer is grounded.

2. The electrostatic lens according to claim 1, wherein said metal layer is deposited on the inner surface of the insulating cylinder in a shape of belt along a circumferential direction thereof.

3. The electrostatic lens according to claim 2, wherein a ratio of an axial length of the high-resistance layer to an axial length of the metal layer adjacent to the high-resistance layer is 1 or more.

4. The electrostatic lens according to claim 3, wherein the ratio of the axial length of the high-resistance layer to the axial length of the metal layer adjacent to the high-resistance layer is about 2.5.

5. The electrostatic lens according to claim 2, wherein said metal layer is continuously deposited on the inner surface of the insulating cylinder along the circumferential direction thereof.

6. The electrostatic lens according to claim 2, wherein said metal layer is intermittently deposited on the inner surface of the insulating cylinder along the circumferential direction thereof.

7. The electrostatic lens according to claim 6, wherein said metal layer comprises four segments disposed apart 90° from each other along the circumferential direction of the inner surface of the insulating cylinder.

8. The electrostatic lens according to claim 2, wherein said metal layer comprises a plurality of belt zones, each extending along the circumferential direction of the inner surface of the insulating cylinder and arranged at a plurality of positions in the axial direction of the cylinder.

9. The electrostatic lens according to claim 1, wherein a resistivity of the high-resistance layer is in the range of about $10^3$ to $10^5$ $\Omega$.cm.

10. The electrostatic lens according to claim 1, wherein a thickness of the high-resistance layer is about 50 angstroms and a thickness of the metal layer is about 250 angstroms.

* * * * *